US012716932B2

(12) United States Patent
Hung et al.

(10) Patent No.: US 12,716,932 B2
(45) Date of Patent: Aug. 25, 2026

(54) ELECTRONIC CIRCUIT SIMULATION BASED ON RANDOM TELEGRAPH SIGNAL NOISE

(71) Applicant: Taiwan Semiconductor Manufacturing Company Limited, Hsinchu (TW)

(72) Inventors: Chien-Ming Hung, Hsinchu (TW); Ming-Long Fan, Hsinchu (TW); Meng-Lin Lu, Keelung City (TW); Ya-Chin Liang, Tainan City (TW); Wai-Kit Lee, Tuen Mun N.T. (HK); Jyun-Yan Kuo, Hsinchu City (TW); Wei-Jen Chang, Miaoli County (TW); Chung-Shi Chiang, Zhubei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 789 days.

(21) Appl. No.: 17/302,577

(22) Filed: May 6, 2021

(65) Prior Publication Data

US 2022/0357390 A1 Nov. 10, 2022

(51) Int. Cl.

| | |
|---|---|
| ***G01R 31/26*** | (2020.01) |
| ***G01R 29/26*** | (2006.01) |
| ***G01R 31/3183*** | (2006.01) |
| ***G06F 30/3308*** | (2020.01) |

(52) U.S. Cl.

CPC ......... *G01R 31/2616* (2013.01); *G01R 29/26* (2013.01); *G01R 31/2601* (2013.01); *G01R 31/318357* (2013.01); *G06F 30/3308* (2020.01)

(58) Field of Classification Search

CPC .......................... G01R 31/2616; G01R 29/26; G01R 31/2601; G01R 31/318357; G06F 30/3308; H04N 25/60

See application file for complete search history.

(56) References Cited

U.S. PATENT DOCUMENTS

| | | | | |
|---|---|---|---|---|
| 5,555,201 A * | 9/1996 | Dangelo | G06F 11/261 | 714/E11.167 |
| 2008/0077378 A1* | 3/2008 | Ikoma | G06F 30/3323 | 703/14 |

OTHER PUBLICATIONS

Van der Wel, Modeling Random Telegraph Noise Under Switched Bias Conditions Using Cyclostationary RTS Noise, May 5, 2003, IEEE Transactions on Electron Devices vol. 50 (Year: 2003).*

Ngspice User's Manual Version 33, Oct. 18, 2020 (Year: 2020).*

Visweswariah, Chandu et al. Noise Considerations in Circuit Optimization, Jun. 6, 2000. <URL: https:/ieeexplore.ieee.org/stamp/stamp.jsp?tp=&arnumber=848089> (Year: 2000).*

* cited by examiner

*Primary Examiner* — Emerson C Puente
*Assistant Examiner* — Michael Paul Mirabito
(74) *Attorney, Agent, or Firm* — Harrity & Harrity, LLP

(57) ABSTRACT

A device may generate, using a random telegraph signal (RTS) noise generator, a simulated RTS noise as input to a transistor included in an electronic circuit. The device may determine, based on the simulated RTS noise input to the transistor, a simulated output signal from the transistor. The device may automatically modify the electronic circuit based on the simulated output signal.

20 Claims, 12 Drawing Sheets

ELECTRONIC CIRCUIT SIMULATION BASED ON RANDOM TELEGRAPH SIGNAL NOISE

BACKGROUND

Random telegraph signal (RTS) noise (also referred to as random telegraph noise (RTN), burst noise, or popcorn noise) is a type of electronic noise that can occur in various types of semiconductor devices, such as transistors, image sensors, and/or the like. RTS noise causes random step-like transitions between two or more discrete voltage or current levels, such as a threshold voltage, a drain current, and/or the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
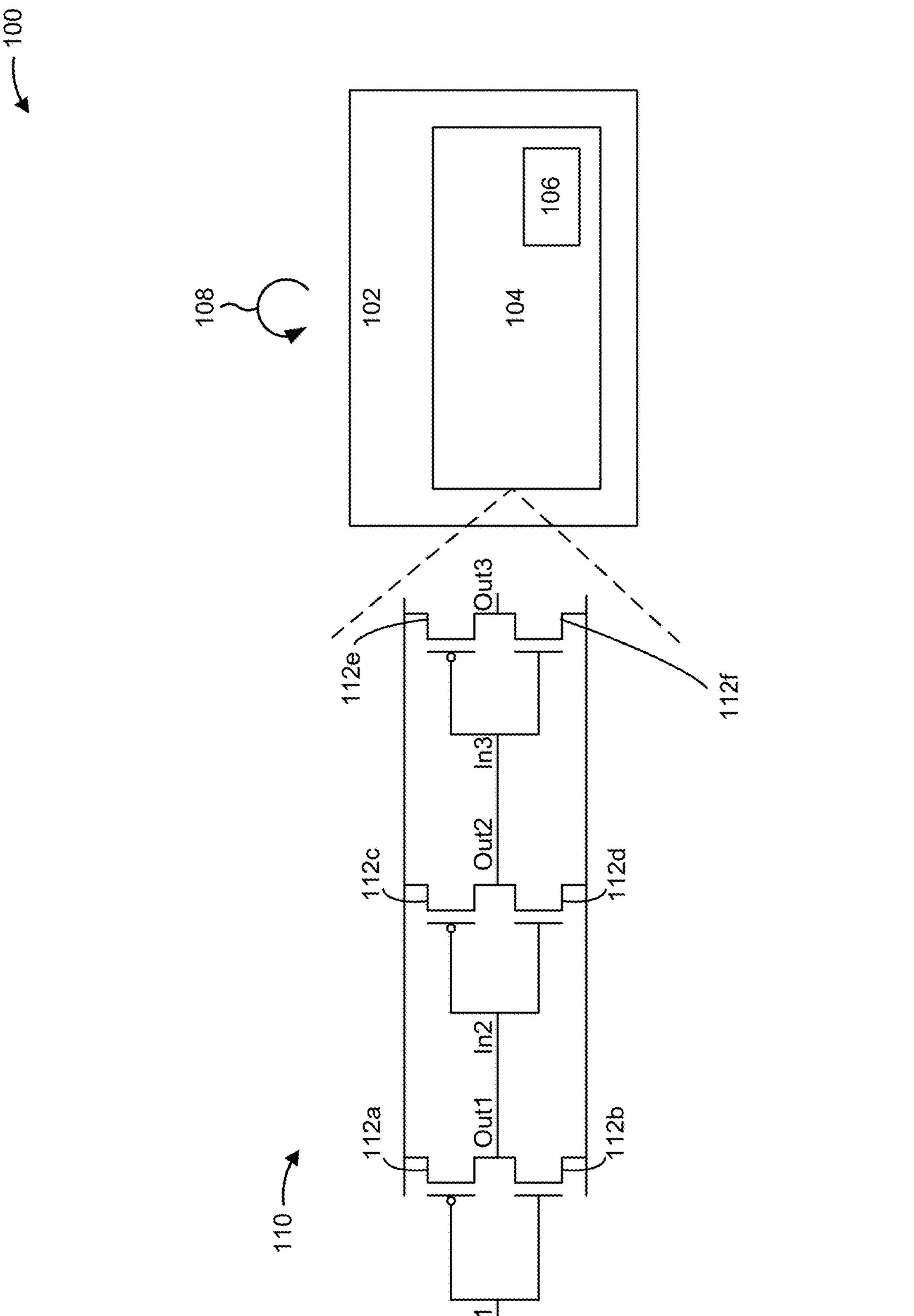
FIGS. 1A-1E are diagrams of one or more example implementations described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As semiconductor devices become smaller, the negative effect on output signals of these semiconductor devices due to RTS noise increases. The effects of RTS noise may be particularly evident in low-power applications, where small fluctuations in voltage or current levels can cause significant changes in an output signal. While some characteristics of a semiconductor device such as a transistor can be modeled and/or simulated using a standardized model (e.g., a compact transistor model), there may be no model available to determine the expected impact of RTS noise on a semiconductor device.

Some implementations described herein provide an RTS noise model, and provide techniques and apparatuses for electronic circuit simulation based on the RTS noise model. The RTS noise model may be used in an RTS generator to generate simulated RTS noise. The simulated RTS noise may be used to simulate and/or determine an expected output signal from a transistor in an electronic circuit design and/or simulation environment. The RTS generator can select and adjust particular parameters for generating simulated RTS noise, such as voltage and/or electrical current bias, temperature, geometry, and/or the like. In this way, the RTS noise model and associated RTS noise generator can be used to simulate the impact of RTS noise on a transistor in an electronic circuit. This permits a circuit designer to design the electronic circuit in a manner that reduces the impact of RTS noise, which improves the design and operation of the electronic circuit. Moreover, having an accurate RTS noise model reduces the cycle time for design, layout, and/or testing of the electronic circuit, which conserves computing resources involved in the design, layout, and/or test of the electronic circuit. Further, having an accurate RTS noise model can increase production yields for the electronic circuit by reducing the quantity of failed acceptance tests due to RTS noise for devices in which the electronic circuit is included.

FIGS. 1A-1E are diagrams of one or more example implementations 100 described herein. As shown in FIGS. 1A-1E, example implementation(s) 100 may include a circuit simulator device 102. The circuit simulator device 102 may be a computing device capable of loading, running, executing, hosting, and/or otherwise providing an electronic circuit simulator 104. In some implementations, the circuit simulator device 102 includes one or more input devices and a display to permit a user (e.g., an engineer, a circuit designer, and/or the like) to access and use the electronic circuit simulator. In some implementations, the circuit simulator device 102 provides information and/or instructions to another device to permit a user to access and use the electronic circuit simulator 104 via the other device.

The electronic circuit simulator 104 may be an application (app), a program, a virtualized software container, and/or the like. The electronic circuit simulator 104 may be a simulation program with integrated circuit emphasis (SPICE) application or a similar type of application that is used for electronic circuit analysis, electronic design automation (EDA), electronic circuit design verification, simulating responses of an electronic circuit based on various simulated inputs, and/or the like. The electronic circuit simulator 104 may include or may communicate with a model interface 106, which may be an application programming interface (API) that is used to support and provide extensions to various circuit simulation models. The circuit simulation models may include transistor models for simulating aging of a transistor, for simulating performance of a common multi-gate transistor or an independent multi-gate transistor, for simulating performance of a transistor at different processing nodes, for statistical modeling of process variations for a transistor, for stress-effect modeling of a transistor, and/or other types of models for simulating the behavior of a transistor. The transistor models may be stored in a circuit simulation database, a circuit simulation electronic library, an electronic file, an electronic file system, and/or in another location on circuit simulator device 102 or on another device.

As shown in FIG. 1A, and by reference number 108, the circuit simulator device 102 may receive information identifying an electronic circuit 110. The information identifying the electronic circuit 110 may be included in one or more electronic files, a file system, a database, and/or the like. In some implementations, the circuit simulator device 102 receives the information identifying the electronic circuit 110 based on input from a user. For example, the user may provide input via one or more input devices as part of generating and/or designing the electronic circuit 110 in a circuit design application. As another example, the user may provide input that instructs the circuit simulator device 102 to receive the information identifying an electronic circuit 110 from another device (e.g., via a wired and/or wireless network), via a communication interface (e.g., a universal serial bus (USB) interface, a serial or parallel interface, and/or the like), and/or the like. Additionally and/or alternatively to receiving the information identifying the electronic circuit 110, the circuit simulator device 102 may store the information identifying the electronic circuit 110 (e.g., in a file system, a storage device, a memory device, a database, and/or the like), and the user may provide input instructing the circuit simulator device 102 to load the information identifying the electronic circuit 110 into the electronic circuit simulator 104.

The electronic circuit 110 may be part of a circuit schematic, a printed circuit board (PCB) layout, and/or the like. As shown in FIG. 1A, the electronic circuit 110 may include one or more transistors 112 (e.g., transistors 112*a*-112*f*), such as one or more metal oxide semiconductor field effect transistors (MOSFETs), one or more bipolar junction transistors (BJTs), one or more complementary metal oxide semiconductor (CMOS) transistors (e.g., one or more P-type metal oxide semiconductor (PMOS) transistors, one or more N-type metal oxide semiconductor (NMOS) transistors, and/or the like), and/or the like. In practice, the electronic circuit 110 can include a greater or lesser quantity of transistors 112. In some implementations, the electronic circuit 110 includes other circuit components, such as one or more resistors, one or more capacitors, one or more inductors, one or more processors, one or more memory devices, and/or the like.

The circuit simulator device 102 may use the electronic circuit simulator 104 to analyze the electronic circuit 110, to simulate the impact on and/or the response of the electronic circuit 110 to various parameters, and/or the like. The various parameters may include various types of inputs, environmental effects (e.g., temperature, solar radiation, and/or the like), physical phenomenon (e.g., RTS noise, electromagnetic interference (EMI), and/or the like), physical characteristics of the one or more transistors (e.g., geometry, manufacturing processes, and/or the like), and/or the like. The electronic circuit simulator 104 may call or invoke one or more transistor models using the model interface 106, and may use the one or more transistor models to analyze the transistors 112 included in the electronic circuit 110.

Figure 1B:
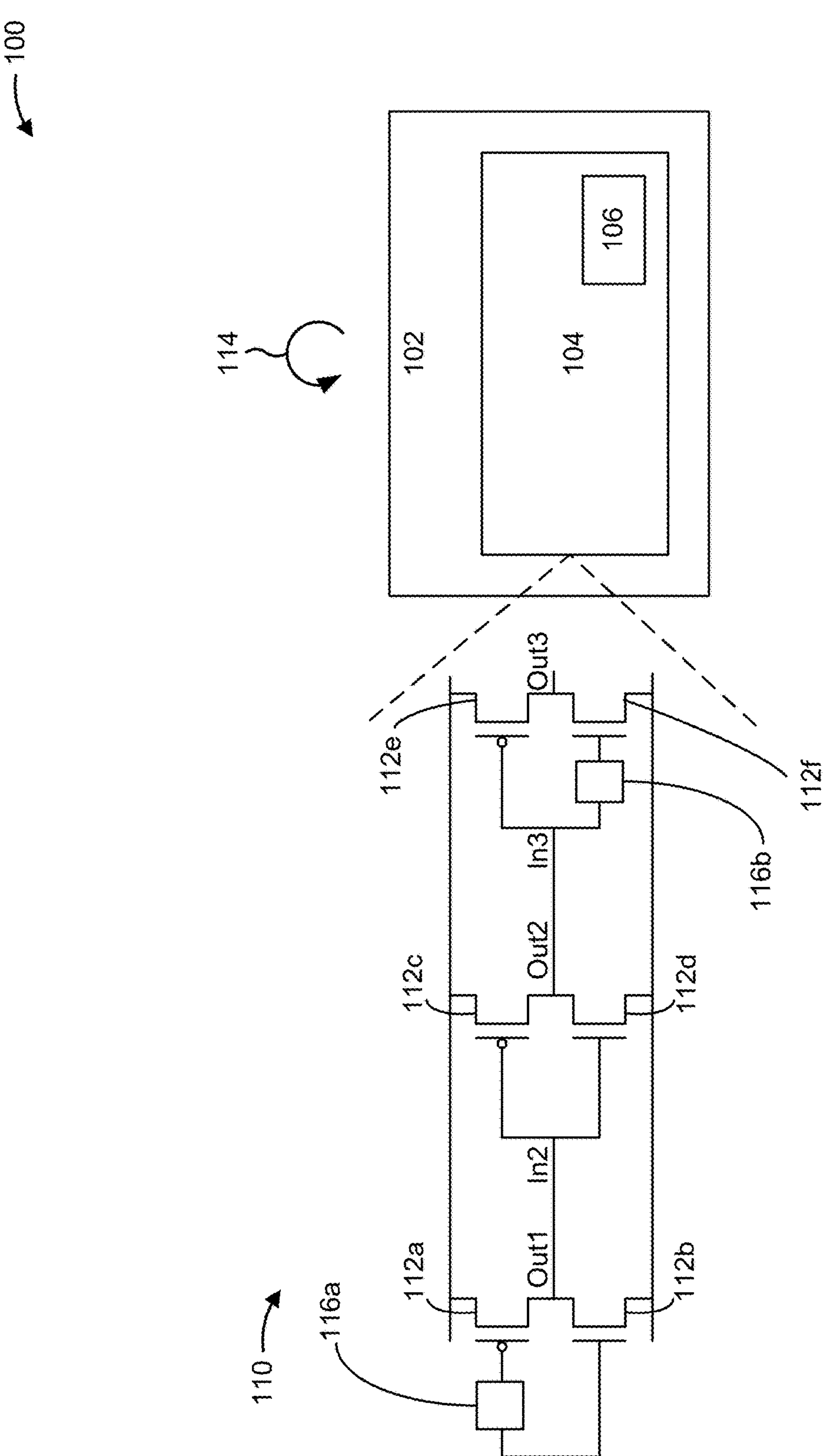

As shown in FIG. 1B, and by reference number 114, the circuit simulator device 102 may use one or more RTS noise generators 116 to generate simulated RTS noise inputs to one or more transistors 112 in the electronic circuit 110. The circuit simulator device 102 may generate the simulated RTS noise inputs to the one or more transistors 112 to simulate the response of the one or more transistors 112, and the effects on the electronic circuit 110, based on the RTS noise that the one or more transistors 112 and the electronic circuit 110 are expected to experience in their physical form (e.g., once the one or more transistors 112 and the electronic circuit 110 are manufactured into a physical device).

An RTS noise generator 116 may be a simulated circuit component that is inserted into the electronic circuit 110. FIG. 1B illustrates an example in which a first RTS noise generator (e.g., RTS noise generator 116*a*) is configured on an input to a gate of a first transistor (e.g., transistor 112*a*) and a second RTS noise generator (e.g., RTS noise generator 116*b*) is configured on an input to a gate of a second transistor (e.g., transistor 112*b*). In other examples, RTS noise generators may be configured for other transistors, RTS noise generators may be configured for a greater quantity of transistors, RTS noise generators may be configured for a lesser quantity of transistors, and/or the like.

An RTS noise generator 116 may generate a simulated RTS noise input to a transistor 112 by modifying the input to the gate of the transistor 112. For example, RTS noise generator 116*a* may modify the input (e.g., In1) to the gate of transistor 112*a* to simulate RTS noise being injected into the gate of transistor 112*a*. In this case, In1 becomes In1', which represents the simulated RTS noise input to the gate of transistor 112*a*. The circuit simulator device 102 may determine In1' as $$In1' = A_{RTS1} + In1$$

where In1' is the simulated RTS noise input based on In1 and $A_{RTS1}$, where $A_{RTS1}$ represents simulated RTS noise. The circuit simulator device 102 may determine $A_{RTS1}$ as a function of one or more simulation parameters for transistor 112*a*. In some implementations, the one or more simulation parameters for transistor 112*a* include one or more simulated biases for transistor 112*a*, such as a simulated direct current (DC) voltage bias (e.g., a simulated gate voltage ($V_G$) bias, a simulated gate-source voltage ($V_{GS}$) bias, and/or the like), a simulated current bias (e.g., a drain current bias ($I_D$), a quiescent current bias, and/or the like), and/or the like. In some implementations, the one or more simulation parameters for transistor 112*a* include a simulated operating temperature for transistor 112*a*, such as a temperature of transistor 112*a*, a simulated environmental temperature for transistor 112*a*, and/or the like. In some implementations, the one or more simulation parameters for transistor 112*a* include one or more simulated geometries (e.g., one or more size parameters, one or more aspect ratio parameters, and/or the like) for transistor 112*a*, such as a gate geometry, a source geometry, a drain geometry, and/or the like. In some implementations, the one or more simulation parameters for transistor 112*a* may include a combination of the above and/or one or more other simulation parameters for transistor 112*a*.

As further shown in FIG. 1B, RTS noise generator 116*b* may modify the input (e.g., In3) to the gate of transistor 112*b* to simulate RTS noise being injected into the gate of transistor 112*b*. In these cases, In3 becomes In3', which represents the simulated RTS noise input to the gate of transistor 112*b*. The circuit simulator device may determine In3' as $$In3' = A_{RTS3} + In3$$

where In3' is the simulated RTS noise input based on In3 and $A_{RTS3}$, where $A_{RTS3}$ represents simulated RTS noise. The circuit simulator device 102 may determine $A_{RTS3}$ as a function of one or more simulation parameters for transistor 112*b*, such as one or more of the simulation parameters described above and/or one or more other simulation parameters. In some implementations, the same simulation parameters and/or the same parameter values may be used to determine $A_{RTS1}$ and $A_{RTS3}$ (and thus, to generate a simulated RTS noise input to transistor 112*a* and a simulated RTS noise input to transistor 112*b*). In some implementations, different simulation parameters (or different combinations of simulation parameters) may be used to determine $A_{RTS1}$ and $A_{RTS3}$ (and thus, to generate a simulated RTS noise input to transistor 112*a* and a simulated RTS noise input to transistor 112*b*). In some implementations, different parameter values for the same simulation parameter may be used to determine $A_{RTS1}$ and $A_{RTS3}$ (and thus, to generate a simulated RTS noise input to transistor 112*a* and a simulated RTS noise input to transistor 112*b*). For example, different geometries may be used to determine $A_{RTS1}$ and $A_{RTS3}$.

The circuit simulator device 102 may use an RTS noise generator 116 to generate a simulated RTS noise input for a transistor 112 based on an RTS noise model. The RTS noise model may be a standalone model that is used with a transistor model, may be a particular type of transistor model, and/or may be included as part of a compact transistor model. The RTS noise model may be a model of the expected behavior of a signal due to RTS noise. The electronic circuit simulator 104 may call or invoke the RTS noise model (or the transistor model in which the RTS noise model is included) using the model interface 106, and may use the RTS noise model to analyze the transistors 112 included in the electronic circuit 110.

Figure 1C:
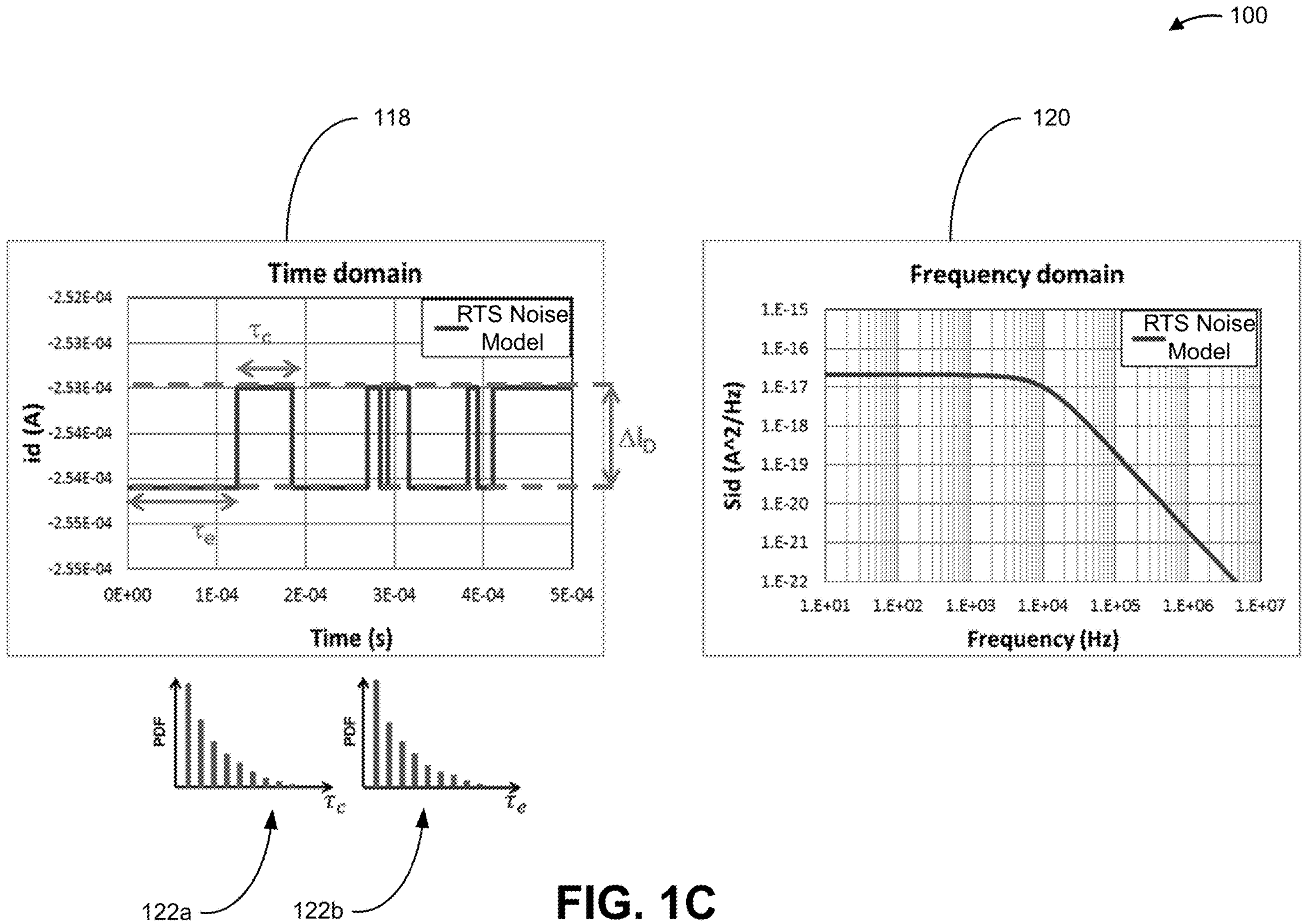

As shown in FIG. 1C, the RTS noise model may include a time domain component 118 and a frequency domain component 120. The time domain component 118 of the RTS noise model may be developed using a stochastic process to represent the time domain behavior of RTS noise on a signal. In this way, the time domain component 118 may define or characterize the expected transitions between two or more discrete voltage levels or electrical current levels for a transistor. In some implementations, and as shown in FIG. 1C, the time domain component 118 may define or characterize the expected transitions between an upper drain current (id in Amps (A)) level and a lower drain current level, where the difference in drain current between the upper drain current level and the lower drain current level is represented as $\Delta I_D$. The time duration that the drain current is expected to remain at the upper drain current level may be represented as ($\tau_c$), and the time duration that the drain current is expected to remain at the lower drain current level may be represented as ($\tau_e$). As shown in FIG. 1C, the expected probability for each duration of $\tau_c$ or $\tau_e$ may be represented as respective probability density functions (PDFs). In the example shown by PDF 122*a* and PDF 122*b* in FIG. 1C, the expected probability decreases as the duration of $\tau_c$ or $\tau_e$ increases. The time domain component 118 of the RTS noise model may be used to model the expected transitions between discrete voltage levels and/or discrete current levels over time, the time durations for the discrete levels, the expected probabilities for each time duration, and/or the like for different simulation parameters (e.g., bias, temperature, geometry, and/or the like).

In some implementations, and as shown in FIG. 1C, the frequency domain component 120 may define or characterize the drain current spectral density ($S_{id}$) for a transistor over a frequency range as a result of RTS noise. In the example illustrated in FIG. 1C, the effect of RTS noise on $S_{id}$ may be defined or characterized as a Lorentzian shape waveform (which may also be referred to as a Lorentzian distribution, a Cauchy distribution, and/or the like), in which $S_{id}$ remains relatively constant over a portion of the frequency range and decreases in a linear manner over another portion of the frequency range. The frequency domain component 120 may be determined as $$S_{id} = \frac{P_S}{1 + (f/fc^2)}$$

where the $S_{id}$ of a transistor at a particular frequency f is based on the one or more simulation parameters $P_S$ for the transistor (e.g., bias (V), temperature (T), geometry (L), and/or the like), the frequency ($f$), and the cutoff frequency ($fc$) for the transistor.

Figure 1D:
Figure 1D:
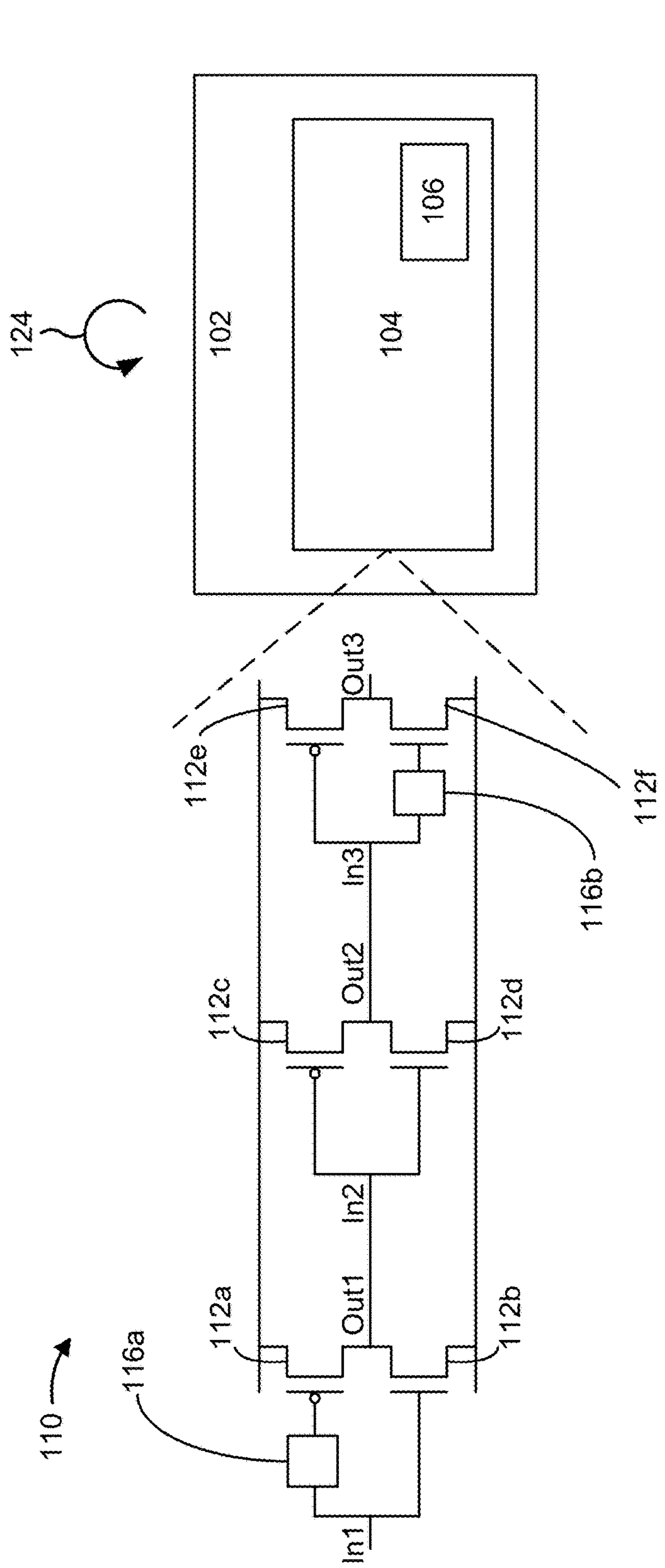

As shown in FIG. 1D, and by reference number 124, the circuit simulator device 102 may determine simulated output signals for each of the one or more transistors 112 based on the simulated RTS noise inputs. For example, the circuit simulator device 102 may determine the simulated output signal (Out1) from the drain (or source) of transistor 112*a* based on the simulated RTS noise input (In1') to the gate of transistor 112*a*, may determine the simulated output signal (Out3) from the drain (or source) of transistor 112*b* based on the simulated RTS noise input (In3') to the gate of transistor 112*b*, and so on. The simulated output signal for a transistor 112 may be a simulated drain current resulting from a simulated RTS noise input, may be a threshold voltage resulting from a simulated RTS noise input, may be a frequency response resulting from a simulated RTS noise input, and/or the like.

In some implementations, the circuit simulator device 102 determines frequency domain simulated output signals for each of the one or more transistors 112 and time domain simulated output signals for each of the one or more transistors 112. In these cases, the circuit simulator device 102 may determine the frequency domain simulated output signals for each of the one or more transistors 112 based on the frequency domain component 120 of the RTS noise model that is used by the RTS noise generators 116 to generate the RTS noise inputs to the one or more transistors 112. Moreover, the circuit simulator device 102 may determine the time domain simulated output signals for each of the one or more transistors 112 based on the time domain component 118 of the RTS noise model that is used by the RTS noise generators 116 to generate the RTS noise inputs to the one or more transistors 112.

In some implementations, the circuit simulator device 102 determines the simulated output signals for each of the one or more transistors 112 over a period of time and/or a frequency range. In some implementations, the circuit simulator device 102 uses the same set of simulation parameters for generating simulated RTS noise across the period of time and/or across the frequency range. In some implementations, the circuit simulator device 102 modifies and/or adjusts the simulation parameters for generating simulated RTS noise inputs across the period of time and/or across the frequency range. For example, the circuit simulator device 102 may use different combinations of simulation parameters, different values for a simulation parameter, and/or the like.

Figure 1E:
Figure 1E:
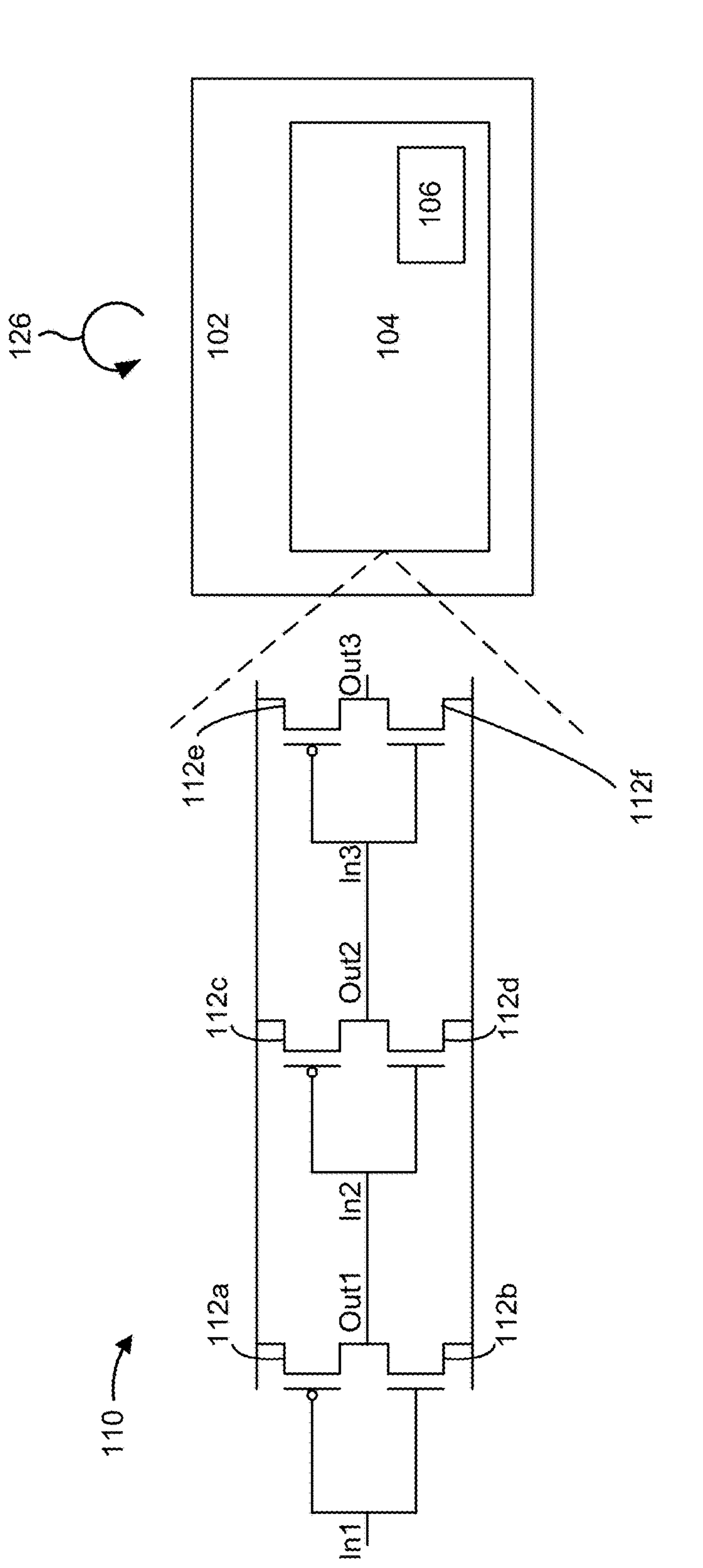

As shown in FIG. 1E, and by reference number 126, the circuit simulator device may automatically modify the electronic circuit 110 based on the simulated output signals for the one or more transistors 112. In this way, the circuit simulator device 102 may automatically modify the electronic circuit 110 based on the expected effects of RTS noise on the output signals. In some implementations, the circuit simulator device 102 automatically modifies the electronic circuit 110 based on determining that the simulated output signals are not within an expected range, based on determining that the simulated output signals do not satisfy a threshold tolerance, and/or the like.

The circuit simulator device 102 may perform various actions and/or use various techniques for modifying the electronic circuit 110 to reduce and/or eliminate the effects of RTS noise. For example, the circuit simulator device 102 may rearrange one or more components (e.g., one or more transistors 112, one or more resistors, one or more capacitors, and/or the like) in the electronic circuit. As another example, the circuit simulator device 102 may add one or more components to the electronic circuit 110. As another example, the circuit simulator device 102 may remove one or more components from the electronic circuit 110. As another example, the circuit simulator device 102 may replace one or more components in the electronic circuit 110 with one or more different components (e.g., different types of components, components of the same type but with different values or parameters, and/or the like). As another example, the circuit simulator device 102 may shorten electrical traces between two or more components in the electronic circuit 110, may lengthen electrical traces between two or more components in the electronic circuit 110, may reroute electrical traces between two or more components in the electronic circuit 110, and/or the like. As another example, the circuit simulator device 102 may modify a PCB layout of the electronic circuit 110 by modifying placement of one or more components in the PCB layout, by moving one or more components to a different layer of the PCB layout, and/or the like. These are just examples of actions that the circuit simulator device 102 may perform to modify the electronic circuit 110. In practice, the circuit simulator device 102 may perform any one or more of the actions identified above and/or one or more other actions not identified above.

Additionally and/or alternatively to automatically modifying the electronic circuit 110, the circuit simulator device 102 may perform one or more other actions based on the simulated output signals for the one or more transistors 112. For example, the circuit simulator device 102 may generate a display of results of the simulated output signals for the one or more transistors 112. As another example, the circuit simulator device 102 may provide information identifying results of the simulated output signals for the one or more transistors 112 and an instruction to display the results. As another example, the circuit simulator device 102 may generate and/or display a notification that the simulated output signals are not within an expected range, a notification that the simulated output signals do not satisfy a threshold tolerance, and/or the like. As another example, the circuit simulator device 102 may (automatically and/or based on input from a user) rerun the simulation on the electronic circuit 110 using different simulation parameters (e.g., different combinations of simulation parameters, different values for the simulation parameters, and/or the like) to generate the simulated RTS noise inputs. As another example, the circuit simulator device 102 may display one or more suggestions for a circuit designer to modify or adjust the electronic circuit 110. These are just examples of actions that the circuit simulator device may perform based on the simulated output signals for the one or more transistors. In practice, the circuit simulator device may perform any one or more of the actions identified above and/or one or more other actions not identified above.

In some implementations, a circuit designer may provide input to the circuit simulator device 102 (e.g., through the circuit simulator 104) based on the simulated output signals for the one or more transistors 112. For example, a circuit designer may modify the electronic circuit 110 and/or one or more of the transistors 112 included therein. In these examples, the circuit simulator device 102 may rerun the RTS noise simulation on the modified electronic circuit 110. As another example, the circuit designer may accept the electronic circuit 110 as-is based on the simulated output signals for the one or more transistors 112. As another example, the circuit designer may provide input to rerun the RTS noise simulation with or without modified simulation parameters based on the simulated output signals for the one or more transistors 112.

As indicated above, FIGS. 1A-1E are provided merely as one or more examples. Other examples may differ from what is described with regard to FIGS. 1A-1E.

Figure 2:
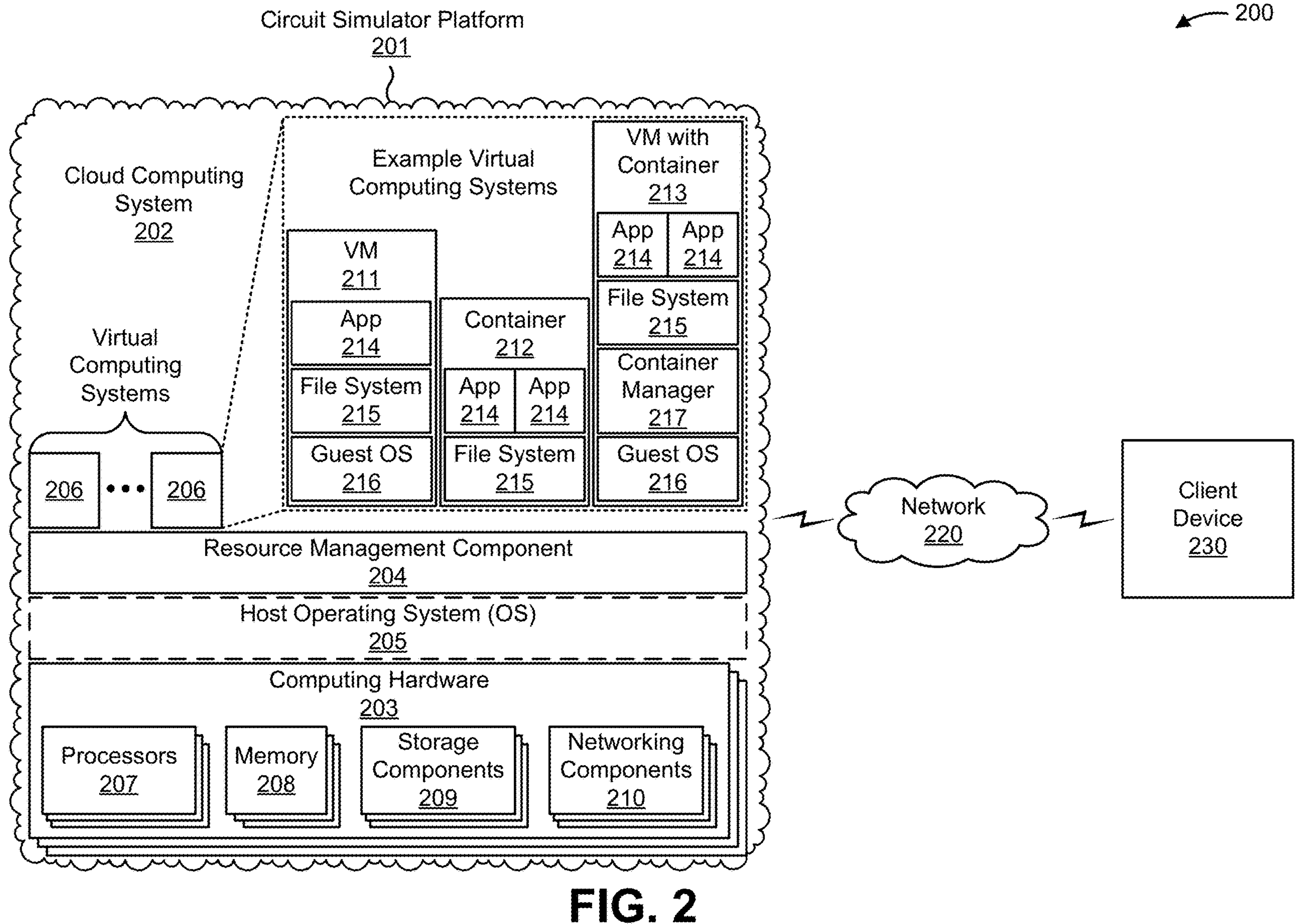
FIG. 2 is a diagram of an example environment in which systems and/or methods described herein may be implemented.

FIG. 2 is a diagram of an example environment 200 in which systems and/or methods described herein may be implemented. As shown in FIG. 2, environment 200 may include a circuit simulator platform 201. The circuit simulator platform 201 may include one or more elements of a cloud computing system 202 and/or may execute within the cloud computing system 202 (e.g., as one or more virtual computing systems 206). The cloud computing system 202 may include one or more elements 203-217, as described in more detail below. As further shown in FIG. 2, environment 200 may include a network 220, a client device 230, and/or other devices. Devices of environment 200 may interconnect via wired connections, wireless connections, or a combination of wired and wireless connections.

The cloud computing system 202 includes computing hardware 203, a resource management component 204, a host operating system (OS) 205, and/or one or more virtual computing systems 206. The resource management component 204 may perform virtualization (e.g., abstraction) of computing hardware 203 to create the one or more virtual computing systems 206. Using such virtualization, the resource management component 204 enables a single computing device (e.g., a computer, a server, a host device, and/or the like) to operate as if the single computing device were multiple computing devices, such as by creating multiple isolated virtual computing systems 206 from computing hardware 203 of the single computing device. The multiple virtual computing systems 206 operate independently from one another and do not interact with one another. In this way, computing hardware 203 can operate more efficiently, with lower power consumption, higher reliability, higher availability, higher utilization, greater flexibility, and lower cost than using separate computing devices.

Computing hardware 203 includes hardware and corresponding resources from one or more computing devices. For example, computing hardware 203 may include hardware from a single computing device (e.g., a single server or host device) or from multiple computing devices (e.g., multiple servers or host devices), such as multiple computing devices in one or more data centers, server farms, server pools, and/or the like. As shown, computing hardware 203 may include one or more processors 207, one or more memories 208, one or more storage components 209, and/or one or more networking components 210. Computing hardware 203 may be interconnected via one or more wired and/or wireless buses, which may interconnect computing hardware 203 within a single computing device and/or across multiple computing devices.

A processor 207 includes a central processing unit, a graphics processing unit, and/or the like. A memory 208 includes random-access memory, read-only memory, and/or the like. The memory 208 may store a set of instructions (e.g., one or more instructions) for execution by the processor 207. The processor 207 may execute the set of instructions to perform one or more operations or processes described herein. In some implementations, execution of the set of instructions, by one or more processors 207, causes the one or more processors 207 and/or the circuit simulator platform 201 to perform one or more operations or processes described herein. A storage component 209 includes a hard disk or another type of storage device that stores information, data, and/or software (e.g., code, instructions, and/or the like) related to the operation and use of the circuit simulator platform 201. In some implementations, memory 208 and/or storage component 209 is/are implemented as a non-transitory computer readable medium. A networking component 210 includes a network interface and corresponding hardware that enables the circuit simulator platform 201 to communicate with other devices of environment 200 via a wired connection and/or a wireless connection, such as via network 220. Additional examples of a processor, a memory, a storage component, and a networking component (e.g., a communication interface) are described elsewhere herein.

The resource management component 204 includes a virtualization application (e.g., executing on hardware, such as computing hardware 203) capable of virtualizing computing hardware 203 to start (e.g., create or spin up), stop (e.g., delete or tear down), and/or manage one or more virtual computing systems 206. Such virtualization may include operating system virtualization, shared kernel virtualization (e.g., container-based virtualization), kernel level virtualization, hypervisor virtualization, paravirtualization, full virtualization, hardware virtualization, and/or the like. The resource management component 204 may control access to and/or use of computing hardware 203 and/or software executing on computing hardware 203. Additionally, or alternatively, the resource management component 204 may perform binary rewriting to scan instructions received from a virtual computing system 206 and replace any privileged instructions with safe emulations of those instructions. The resource management component 204 may include a hypervisor or a virtual machine monitor, such as when the virtual computing systems 206 are virtual machines 211. Additionally, or alternatively, the resource management component 204 may include a container manager, such as when the virtual computing systems 206 are containers 212.

In some implementations, the resource management component 204 executes within and/or in coordination with a host operating system 205. For example, the resource management component 204 may execute on top of the host operating system 205 rather than interacting directly with computing hardware 203, such as when the resource management component 204 is a hosted hypervisor (e.g., a Type 2 hypervisor) or a container manager. In this case, the host operating system 205 may control access to and/or use of computing hardware 203 and/or software executing on computing hardware 203 based on information and/or instructions received from the resource management component 204. Alternatively, the resource management component 204 may interact directly with computing hardware 203 rather than interacting with the host operating system 205, such as when the resource management component 204 is a bare-metal hypervisor (e.g., a Type 1 hypervisor). Thus, in some implementations, the cloud computing system 202 does not include a host operating system 205. In some implementations, the host operating system 205 includes and/or executes an administrator application to enable a system administrator to manage, customize, and/or configure cloud computing system 202.

A virtual computing system 206 includes a virtual environment that enables cloud-based execution of operations and/or processes described herein using computing hardware 203. As shown, a virtual computing system 206 may include a virtual machine 211, a container 212, a hybrid environment 213 that includes a virtual machine and a container, and/or the like. A virtual computing system 206 may execute one or more applications 214 using a file system 215. The file system 215 may include binary files, software libraries, and/or other resources required to execute applications 214 on a guest operating system 216 or the host operating system 205. In some implementations, a virtual computing system 206 (e.g., a virtual machine 211 or a hybrid environment 213) includes a guest operating system 216. In some implementations, a virtual computing system 206 (e.g., a container 212 or a hybrid environment 213) includes a container manager 217.

A virtual machine 211 is an emulation of a computing device that enables execution of separate, isolated instances of virtual computing devices (e.g., multiple virtual machines 211) on the same computing hardware 203. The guest operating systems 216 and applications 214 of multiple virtual machines 211 may share computing hardware 203 from a single computing device or from multiple computing devices (e.g., a pool of computing devices). Each separate virtual machine 211 may include a guest operating system 216, a file system 215, and one or more applications 214. With a virtual machine 211, the underlying computing hardware 203 is virtualized, and the guest operating system 216 executes on top of this virtualized hardware. Using virtual machines 211 enables different types of guest operating systems 216 to execute on the same computing hardware 203 in an isolated environment, but with more resource usage and overhead than containers 212.

Unlike a virtual machine 211, a container 212 virtualizes a host operating system 205 rather than the underlying computing hardware 203. Thus, a container 212 does not require a guest operating system 216 because the application(s) 214 included in the container 212 execute directly on the host operating system 205 using a file system 215 included in the container 212. Each separate container 212 may share the kernel of the host operating system 205, and different applications 214 within a single container 212 may share a file system 215. This sharing of a file system 215 among multiple applications 214 reduces the need to reproduce operating system code for different applications, and enables a single host operating system 205 to execute multiple applications 214 and/or containers 212. As a result, containers 212 enable a greater quantity of applications 214 to execute on a smaller quantity of computing devices as compared to virtual machines 211.

A hybrid environment 213 includes elements of a virtual machine 211 and a container 212. For example, a hybrid environment 213 may include a guest operating system 216 that executes on top of virtualized hardware. A container manager 217 may execute on top of the guest operating system 216 to start, stop, and/or manage one or more containers within the hybrid environment 213. Using a hybrid environment 213 enables different types of guest operating systems 216 to execute on the same computing hardware 203 in an isolated environment, while also enabling lightweight containers to execute on top of the guest operating system 216.

The quantity of applications 214 shown in FIG. 2 as executing within each virtual computing system 206 is shown as an example, and a different quantity of applications 214 may execute within each virtual computing system. Furthermore, although the circuit simulator platform 201 may include one or more elements 203-217 of the cloud computing system 202, may execute within the cloud computing system 202, and/or may be hosted within the cloud computing system 202, in some implementations, the circuit simulator platform 201 may not be cloud-based (e.g., may be implemented outside of a cloud computing system) or may be partially cloud-based. For example, the circuit simulator platform 201 may include one or more devices that are not part of the cloud computing system 202, such as device 300 of FIG. 3, which may include a standalone server or another type of computing device. The circuit simulator platform 201 may perform one or more operations and/or processes described in more detail elsewhere herein.

Circuit simulator platform 201 is capable of receiving, generating, storing, processing, and/or providing information associated with electronic circuit simulation based on RTS noise. Circuit simulator platform 201 is capable of receiving, from client device 230 and/or another device, information identifying an electronic circuit and a request to simulate the effects of RTS noise on the electronic circuit based on an RTS noise model and/or to automatically modify the electronic circuit to reduce the expected RTS noise effects on the electronic circuit. Circuit simulator platform 201 is capable of simulating the effects of RTS noise on the electronic circuit based on an RTS noise model, capable of automatically modifying the electronic circuit to reduce the expected RTS noise effects on the electronic circuit, and/or the like. Circuit simulator platform 201 is capable of providing, to client device 230, information identifying results from the simulation, information identifying a modified electronic circuit, and/or the like. In some implementations, circuit simulator platform 201 may perform one or more actions and/or techniques performed by the circuit simulator device 102 described above in connection with FIGS. 1A-1E.

Network 220 includes one or more wired and/or wireless networks. For example, network 220 may include a cellular network (e.g., a fifth generation (5G) network, a fourth generation (4G) network, a long-term evolution (LTE) network, a third generation (3G) network, a code division multiple access (CDMA) network, etc.), a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, and/or the like, and/or a combination of these or other types of networks. The network 220 enables communication among the devices of environment 200.

The client device 230 includes one or more devices capable of receiving, generating, storing, processing, and/or providing information associated with electronic circuit simulation based on RTS noise. For example, client device 230 may be a laptop computer, a tablet computer, a handheld computer, a desktop computer, a server device, and/or the like. In some implementations, client device 230 is capable of receiving information identifying an electronic circuit, capable of simulating the effects of RTS noise on the electronic circuit based on an RTS noise model, capable of automatically modifying the electronic circuit to reduce the expected RTS noise effects on the electronic circuit, and/or the like. In some implementations, client device 230 is capable of providing, to circuit simulator platform 201, information identifying an electronic circuit and a request to simulate the effects of RTS noise on the electronic circuit based on an RTS noise model and/or to automatically modify the electronic circuit to reduce the expected RTS noise effects on the electronic circuit. In these cases, client device 230 may receive, from circuit simulator platform 201, information identifying results from the simulation, information identifying a modified electronic circuit, and/or the like based on providing the request to circuit simulator platform 201. In some implementations, client device 230 may perform one or more actions and/or techniques performed by the circuit simulator device 102 described above in connection with FIGS. 1A-1E.

The number and arrangement of devices and networks shown in FIG. 2 are provided as an example. In practice, there may be additional devices and/or networks, fewer devices and/or networks, different devices and/or networks, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of environment 200 may perform one or more functions described as being performed by another set of devices of environment 200.

Figure 3:
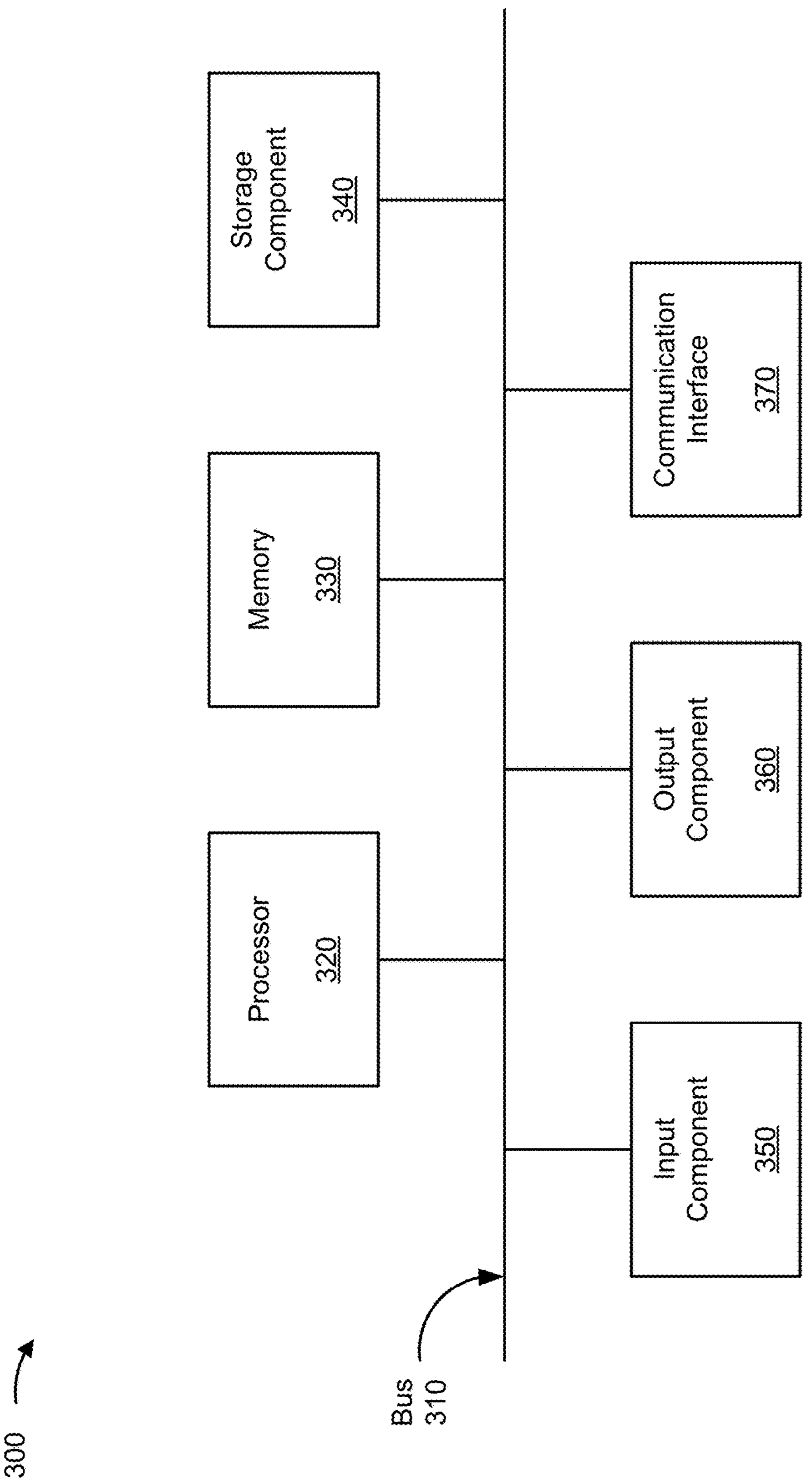
FIG. 3 is a diagram of example components of one or more devices of FIG. 2.

FIG. 3 is a diagram of example components of a device 300. Device 300 may correspond to the circuit simulator device 102 of FIGS. 1A-1E, circuit simulator platform 201, cloud computing system 202, computing hardware 203, processors 207, memory 208, storage components 209, network components 210, one or more devices included in network 220, and/or client device 230. In some implementations, the circuit simulator device 102 of FIGS. 1A-1E, circuit simulator platform 201, cloud computing system 202, computing hardware 203, processors 207, memory 208, storage components 209, network components 210, one or more devices included in network 220, and/or client device 230 may include one or more devices 300 and/or one or more components of device 300. As shown in FIG. 3, device 300 may include a bus 310, a processor 320, a memory 330, a storage component 340, an input component 350, an output component 360, and a communication interface 370.

Bus 310 includes a component that permits communication among multiple components of device 300. Processor 320 is implemented in hardware, firmware, and/or a combination of hardware and software. Processor 320 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 320 includes one or more processors capable of being programmed to perform a function. Memory 330 includes a random access memory (RANI), a read only memory (ROM), and/or another type of dynamic or static storage device (e.g., a flash memory, a magnetic memory, and/or an optical memory) that stores information and/or instructions for use by processor 320.

Storage component 340 stores information and/or software related to the operation and use of device 300. For example, storage component 340 may include a hard disk (e.g., a magnetic disk, an optical disk, and/or a magneto-optic disk), a solid state drive (SSD), a compact disc (CD), a digital versatile disc (DVD), a floppy disk, a cartridge, a magnetic tape, and/or another type of non-transitory computer-readable medium, along with a corresponding drive.

Input component 350 includes a component that permits device 300 to receive information, such as via user input (e.g., a touch screen display, a keyboard, a keypad, a mouse, a button, a switch, and/or a microphone). Additionally, or alternatively, input component 350 may include a component for determining location (e.g., a global positioning system (GPS) component) and/or a sensor (e.g., an accelerometer, a gyroscope, an actuator, another type of positional or environmental sensor, and/or the like). Output component 360 includes a component that provides output information from device 300 (via, e.g., a display, a speaker, a haptic feedback component, an audio or visual indicator, and/or the like).

Communication interface 370 includes a transceiver-like component (e.g., a transceiver, a separate receiver, a separate transmitter, and/or the like) that enables device 300 to communicate with other devices, such as via a wired connection, a wireless connection, or a combination of wired and wireless connections. Communication interface 370 may permit device 300 to receive information from another device and/or provide information to another device. For example, communication interface 370 may include an Ethernet interface, an optical interface, a coaxial interface, an infrared interface, a radio frequency (RF) interface, a universal serial bus (USB) interface, a Wi-Fi interface, a cellular network interface, and/or the like.

Device 300 may perform one or more processes described herein. Device 300 may perform these processes based on processor 320 executing software instructions stored by a non-transitory computer-readable medium, such as memory 330 and/or storage component 340. As used herein, the term "computer-readable medium" refers to a non-transitory memory device. A memory device includes memory space within a single physical storage device or memory space spread across multiple physical storage devices.

Software instructions may be read into memory 330 and/or storage component 340 from another computer-readable medium or from another device via communication interface 370. When executed, software instructions stored in memory 330 and/or storage component 340 may cause processor 320 to perform one or more processes described herein. Additionally, or alternatively, hardware circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

Figure 4:
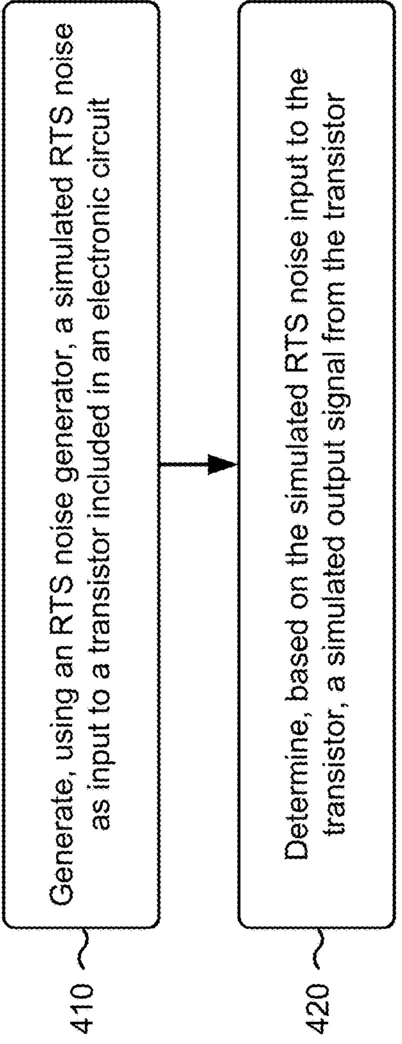
FIGS. 4-8 are flowcharts of example processes for electronic circuit simulation based on random telegraph signal (RTS) noise.

FIG. 4 is a flow chart of an example process 400 associated with electronic circuit simulation based on RTS noise. In some implementations, one or more process blocks of FIG. 4 may be performed by a device (e.g., the circuit simulator device 102 of FIGS. 1A-1E, circuit simulator platform 201, cloud computing system 202, computing hardware 203, client device 230, and/or the like). Additionally, or alternatively, one or more process blocks of FIG. 4 may be performed by one or more components of a device 300, such as processor 320, memory 330, storage component 340, input component 350, output component 360, communication interface 370, and/or the like.

As shown in FIG. 4, process 400 may include generating, using an RTS noise generator, a simulated RTS noise as input to a transistor included in an electronic circuit (block 410). For example, the device (e.g., using computing hardware 203, processors 207, memory 208, storage components 209, networking components 210, processor 320, memory 330, storage component 340, input component 350, output component 360, communication interface 370, and/or the like) may generate, using an RTS noise generator, a simulated RTS noise as input to a transistor included in an electronic circuit, as described above.

As further shown in FIG. 4, process 400 may include determining, based on the simulated RTS noise input to the transistor, a simulated output signal from the transistor (block 420). For example, the device (e.g., using computing hardware 203, processors 207, memory 208, storage components 209, networking components 210, processor 320, memory 330, storage component 340, input component 350, output component 360, communication interface 370, and/or the like) may determine, based on the simulated RTS noise input to the transistor, a simulated output signal from the transistor, as described above.

Process 400 may include additional implementations, such as any single implementation or any combination of implementations described below and/or in connection with one or more other processes described elsewhere herein.

In a first implementation, the simulated RTS noise is input to a gate of the transistor, and determining the simulated output signal from the transistor includes determining the simulated output signal from a drain of the transistor. In a second implementation, alone or in combination with the first implementation, process 400 includes generating simulated RTS noise as input to another transistor included in the electronic circuit, wherein at least a subset of parameters for generating the simulated RTS noise as input to the transistor have different parameter values than at least a subset of parameters for generating the simulated RTS noise as input to the other transistor. In a third implementation, alone or in combination with one or more of the first and second implementations, generating the simulated RTS noise as input to the transistor includes generating, based on one or more simulation parameters associated with the transistor, the simulated RTS noise as input to the transistor.

In a fourth implementation, alone or in combination with one or more of the first through third implementations, the one or more simulation parameters comprise at least one of a simulated operating temperature of the transistor, or a simulated geometry of the transistor. In a fifth implementation, alone or in combination with one or more of the first through fourth implementations, generating the simulated RTS noise as input to the transistor includes adjusting the one or more simulation parameters, and generating, based on adjusting the one or more simulation parameters, the simulated RTS noise as input to the transistor. In a sixth implementation, alone or in combination with one or more of the first through fifth implementations, determining the simulated output signal from the transistor includes determining the simulated output signal from the transistor based on the simulated RTS noise being generated based on adjusting the one or more simulation parameters.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Figure 5:
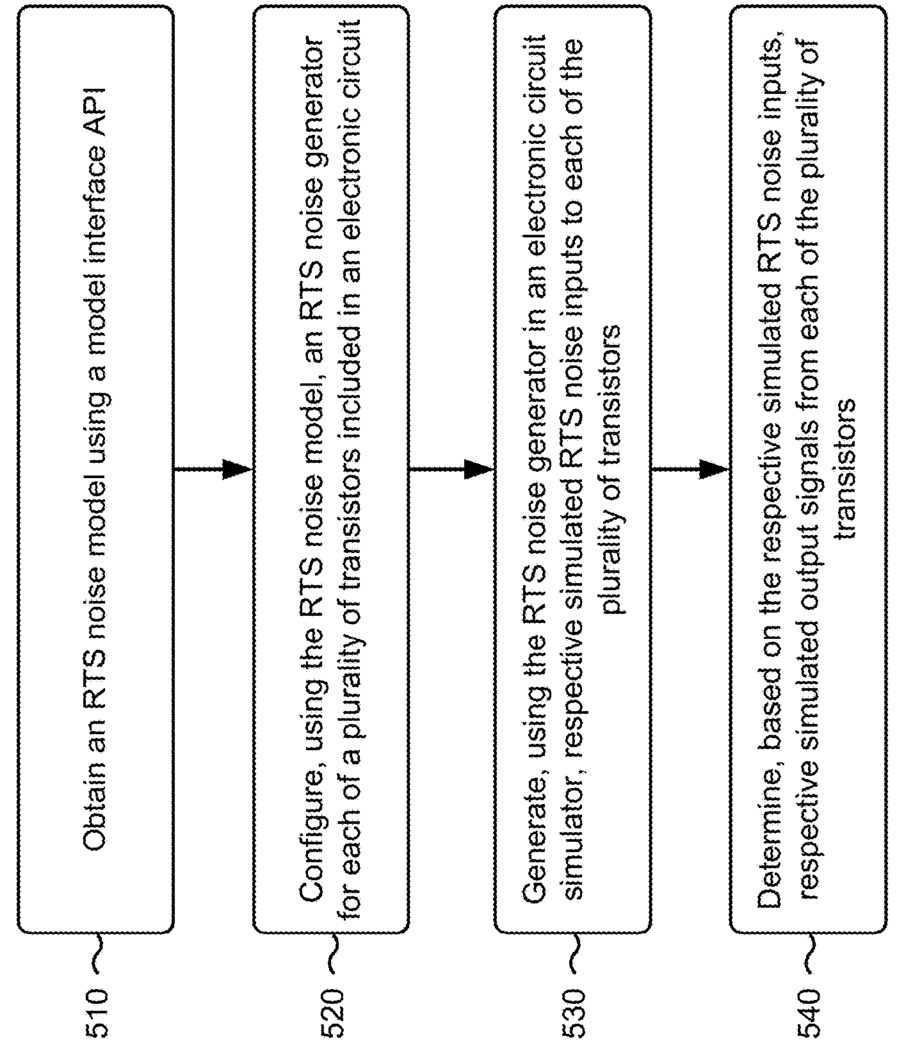

FIG. 5 is a flow chart of an example process 500 associated with electronic circuit simulation based on random telegraph signal noise. In some implementations, one or more process blocks of FIG. 5 may be performed by a device (e.g., the circuit simulator device 102 of FIGS. 1A-1E, circuit simulator platform 201, cloud computing system 202, computing hardware 203, client device 230, and/or the like). Additionally, or alternatively, one or more process blocks of FIG. 5 may be performed by one or more components of a device 300, such as processor 320, memory 330, storage component 340, input component 350, output component 360, communication interface 370, and/or the like.

As shown in FIG. 5, process 500 may include obtaining a RTS noise model using a model interface API (block 510). For example, the device (e.g., using computing hardware 203, processors 207, memory 208, storage components 209, networking components 210, processor 320, memory 330, storage component 340, input component 350, output component 360, communication interface 370, and/or the like) may obtain a RTS noise model using a model interface API, as described above.

As further shown in FIG. 5, process 500 may include configuring, using the RTS noise model, an RTS noise generator for each of a plurality of transistors included in an electronic circuit (block 520). For example, the device (e.g., using computing hardware 203, processors 207, memory 208, storage components 209, networking components 210, processor 320, memory 330, storage component 340, input component 350, output component 360, communication interface 370, and/or the like) may configure, using the RTS noise model, an RTS noise generator for each of a plurality of transistors included in an electronic circuit, as described above.

As shown in FIG. 5, process 500 may include generating, using the RTS noise generator in an electronic circuit simulator, respective simulated RTS noise inputs to each of the plurality of transistors (block 530). For example, the device (e.g., using computing hardware 203, processors 207, memory 208, storage components 209, networking components 210, processor 320, memory 330, storage component 340, input component 350, output component 360, communication interface 370, and/or the like) may generate, using the RTS noise generator in an electronic circuit simulator, respective simulated RTS noise inputs to each of the plurality of transistors.

As further shown in FIG. 5, process 500 may include determining, based on the respective simulated RTS noise inputs, respective simulated output signals from each of the plurality of transistors (block 540). For example, the device (e.g., using computing hardware 203, processors 207, memory 208, storage components 209, networking components 210, processor 320, memory 330, storage component 340, input component 350, output component 360, communication interface 370, and/or the like) may determine, based on the respective simulated RTS noise inputs, respective simulated output signals from each of the plurality of transistors, as described above.

Process 500 may include additional implementations, such as any single implementation or any combination of implementations described below and/or in connection with one or more other processes described elsewhere herein.

In a first implementation, the RTS noise model comprises: a time domain component, and a frequency domain component. In a second implementation, alone or in combination with the first implementation, process 500 includes determining, for a transistor of the plurality of transistors a time domain is simulating output signal based on the time domain component and a frequency domain is simulating output signal based on the frequency domain component. In a third implementation, alone or in combination with one or more of the first and second implementations, the time domain component models at least one of one or more expected transitions between discrete electrical current levels over time or one or more expected transitions between discrete voltage levels over time.

In a fourth implementation, alone or in combination with one or more of the first through third implementations, the time domain component identifies one or more expected transitions between discrete drain current levels over a time duration. In a fifth implementation, alone or in combination with one or more of the first through fourth implementations, the frequency domain component identifies a drain current spectral density over a frequency range. In a sixth implementation, alone or in combination with one or more of the first through fifth implementations, the frequency domain component is based on a Lorentzain line shape waveform.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

Figure 6:
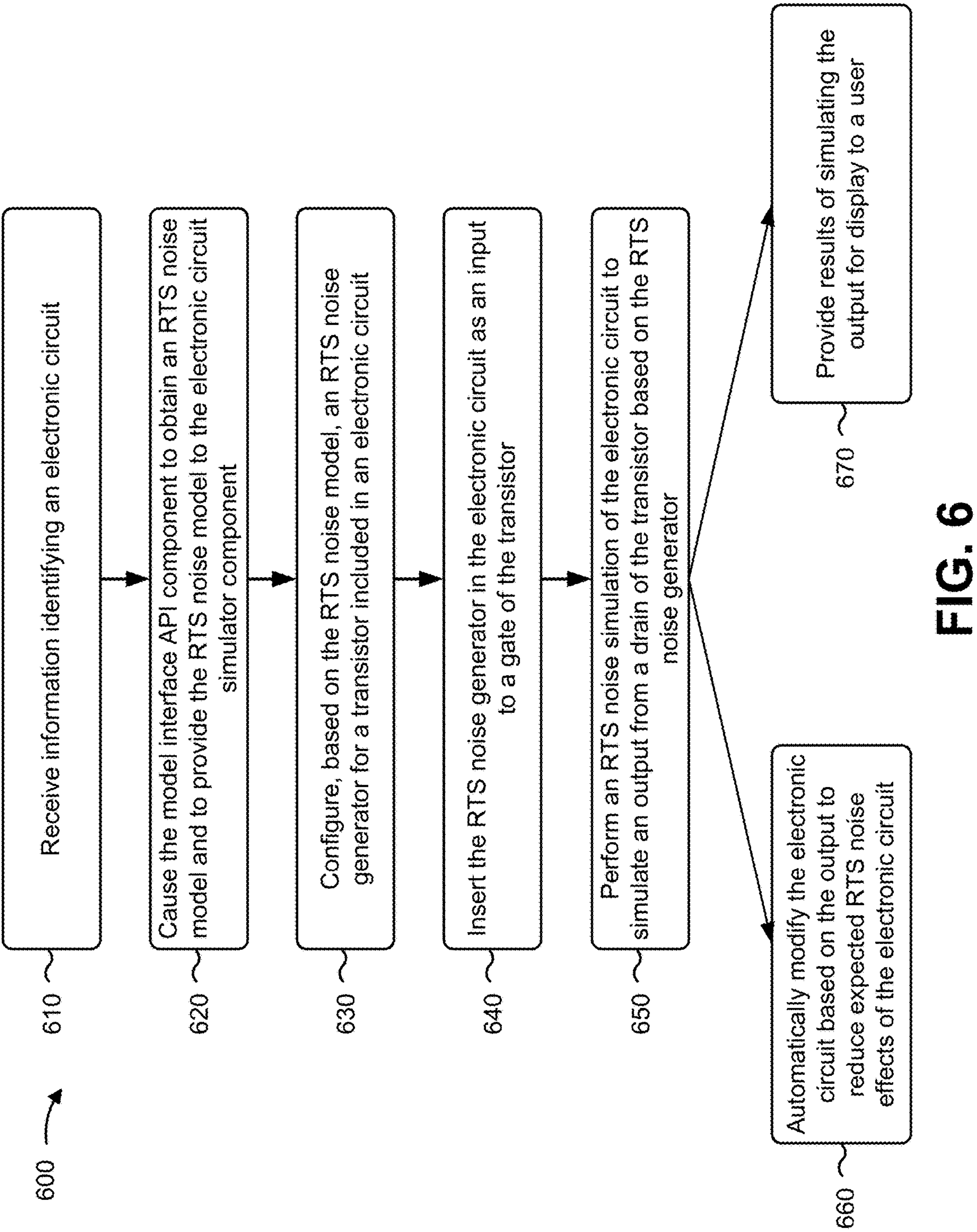

FIG. 6 is a flow chart of an example process 600 associated with electronic circuit simulation based on random telegraph signal noise. In some implementations, one or more process blocks of FIG. 6 may be performed by a device (e.g., the circuit simulator device 102 of FIGS. 1A-1E, circuit simulator platform 201, cloud computing system 202, computing hardware 203, client device 230, and/or the like). Additionally, or alternatively, one or more process blocks of FIG. 6 may be performed by one or more components of a device 300, such as processor 320, memory 330, storage component 340, input component 350, output component 360, communication interface 370, and/or the like.

As shown in FIG. 6, process 600 may include receiving information identifying an electronic circuit (block 610). For example, the device (e.g., using computing hardware 203, processors 207, memory 208, storage components 209, networking components 210, processor 320, memory 330, storage component 340, input component 350, output component 360, communication interface 370, and/or the like) may receive information identifying an electronic circuit, as described above.

As further shown in FIG. 6, process 600 may include causing the model interface API component to obtain an RTS noise model and to provide the RTS noise model to the electronic circuit simulator component (block 620). For example, the device (e.g., using computing hardware 203, processors 207, memory 208, storage components 209, networking components 210, processor 320, memory 330, storage component 340, input component 350, output component 360, communication interface 370, and/or the like) may cause the model interface API component to obtain an RTS noise model and to provide the RTS noise model to the electronic circuit simulator component, as described above.

As further shown in FIG. 6, process 600 may include configuring, based on the RTS noise model, an RTS noise generator for a transistor included in an electronic circuit (block 630). For example, the device (e.g., using computing hardware 203, processors 207, memory 208, storage components 209, networking components 210, processor 320, memory 330, storage component 340, input component 350, output component 360, communication interface 370, and/or the like) may configure, based on the RTS noise model, an RTS noise generator for a transistor included in an electronic circuit, as described above.

As further shown in FIG. 6, process 600 may include inserting the RTS noise generator in the electronic circuit as an input to a gate of the transistor (block 640). For example, the device (e.g., using computing hardware 203, processors 207, memory 208, storage components 209, networking components 210, processor 320, memory 330, storage component 340, input component 350, output component 360, communication interface 370, and/or the like) may insert the RTS noise generator in the electronic circuit as an input to a gate of the transistor, as described above.

As further shown in FIG. 6, process 600 may include performing an RTS noise simulation of the electronic circuit to simulate an output from a drain of the transistor based on the RTS noise generator (block 650). For example, the device (e.g., using computing hardware 203, processors 207, memory 208, storage components 209, networking components 210, processor 320, memory 330, storage component 340, input component 350, output component 360, communication interface 370, and/or the like) may perform an RTS noise simulation of the electronic circuit to simulate an output from a drain of the transistor based on the RTS noise generator, as described above.

As further shown in FIG. 6, process 600 may include automatically modifying the electronic circuit based on the output to reduce expected RTS noise effects of the electronic circuit (block 660). For example, the device (e.g., using computing hardware 203, processors 207, memory 208, storage components 209, networking components 210, processor 320, memory 330, storage component 340, input component 350, output component 360, communication interface 370, and/or the like) may automatically modify the electronic circuit based on the output to reduce expected RTS noise effects of the electronic circuit, as described above.

As further shown in FIG. 6, process 600 may include providing results of simulating the output for display to a user (block 670). For example, the device (e.g., using computing hardware 203, processors 207, memory 208, storage components 209, networking components 210, processor 320, memory 330, storage component 340, input component 350, output component 360, communication interface 370, and/or the like) may provide results of simulating the output for display to a user, as described above.

Process 600 may include additional implementations, such as any single implementation or any combination of implementations described below and/or in connection with one or more other processes described elsewhere herein.

In a first implementation, process 600 includes generating an RTS noise input to the gate of the transistor and simulating, based on the RTS noise input, the output from the drain of the transistor. In a second implementation, alone or in combination with the first implementation, process 600 includes generating the RTS noise input based on at least one of a DC voltage bias associated with the transistor or a current bias is associating with the transistor. In a third implementation, alone or in combination with one or more of the first and second implementations, the RTS noise model is a time domain RTS noise model, and simulating the output from the drain of the transistor includes simulating, based on the time domain RTS noise model, a time domain output from the drain of the transistor.

In a fourth implementation, alone or in combination with one or more of the first through third implementations, the RTS noise model is a frequency domain RTS noise model, and simulating the output from the drain of the transistor includes simulating, based on the frequency domain RTS noise model, a frequency domain output from the drain of the transistor. In a fifth implementation, alone or in combination with one or more of the first through fourth implementations, automatically modifying the electronic circuit includes at least one of automatically adding one or more circuit components to the electronic circuit, automatically replacing one or more circuit components in the electronic circuit with one or more other circuit components, or automatically modifying a layout of the electronic circuit.

In a fifth implementation, alone or in combination with one or more of the first through fourth implementations, process 600 includes automatically performing a plurality of iterative RTS noise simulations for one or more modified versions of the electronic circuit based on automatically modifying the electronic circuit. In a sixth implementation, alone or in combination with one or more of the first through fifth implementations, process 600 includes receiving, based on providing the results of simulating the output for display to the user, input indicating one or more modifications to the electronic circuit and an instruction to rerun the RTS noise simulation of the electronic circuit, generating a modified electronic circuit based on the one or more modifications, and performing the RTS noise simulation on the modified electronic circuit.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

Figure 7:
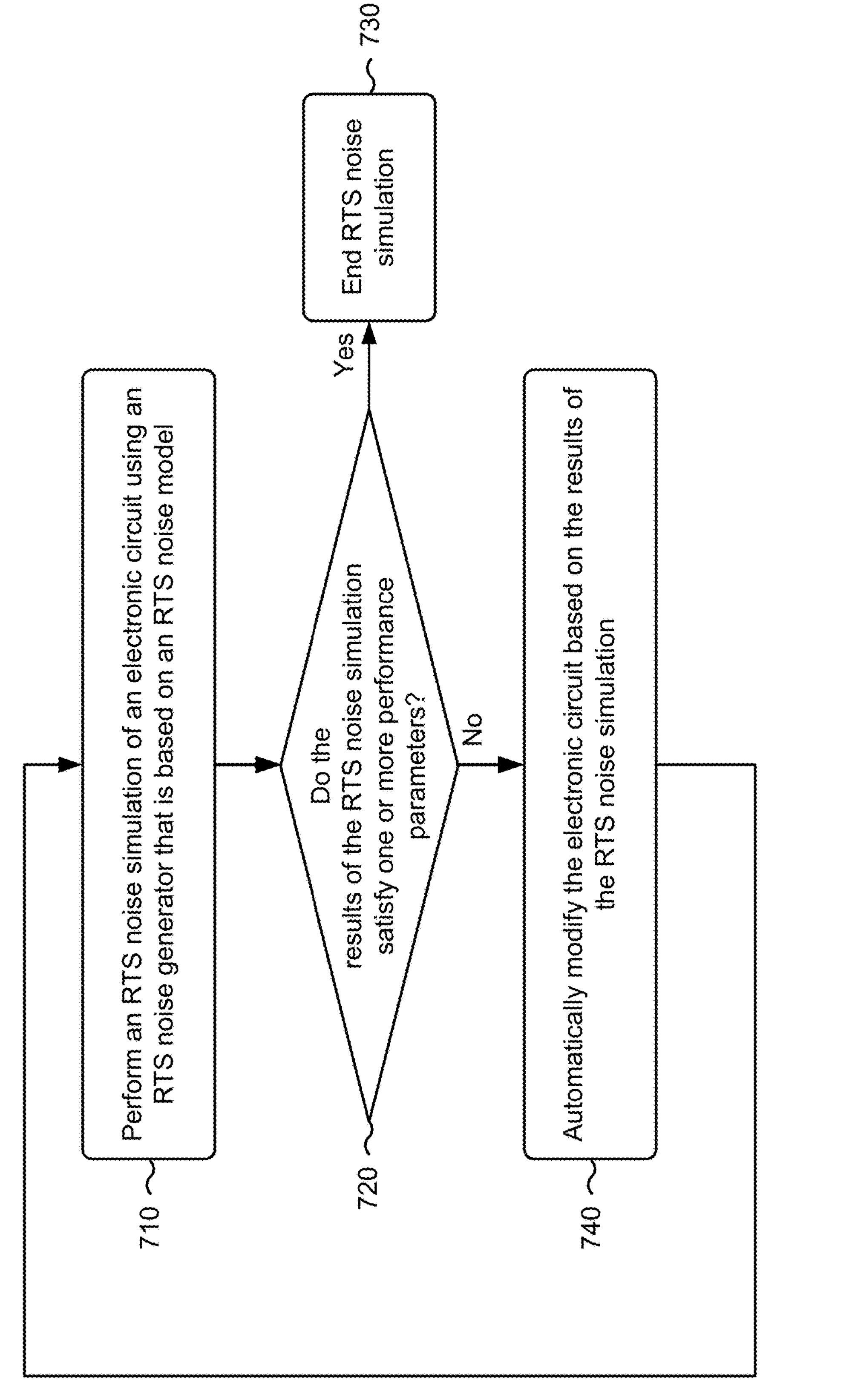

FIG. 7 is a flow chart of an example process 700 associated with electronic circuit simulation based on random telegraph signal noise. In some implementations, one or more process blocks of FIG. 7 may be performed by a device (e.g., the circuit simulator device 102 of FIGS. 1A-1E, circuit simulator platform 201, cloud computing system 202, computing hardware 203, client device 230, and/or the like). Additionally, or alternatively, one or more process blocks of FIG. 7 may be performed by one or more components of a device 300, such as processor 320, memory 330, storage component 340, input component 350, output component 360, communication interface 370, and/or the like.

As shown in FIG. 7, process 700 may include performing an RTS noise simulation of an electronic circuit using an RTS noise generator that is based on an RTS noise model (block 710). For example, the device (e.g., using computing hardware 203, processors 207, memory 208, storage components 209, networking components 210, processor 320, memory 330, storage component 340, input component 350, output component 360, communication interface 370, and/or the like) may perform an RTS noise simulation of an electronic circuit using an RTS noise generator that is based on an RTS noise model, as described above.

As further shown in FIG. 7, process 700 may include determining whether the results of the RTS noise simulation satisfy one or more performance parameters (block 720). For example, the device (e.g., using computing hardware 203, processors 207, memory 208, storage components 209, networking components 210, processor 320, memory 330, storage component 340, input component 350, output component 360, communication interface 370, and/or the like) may determine whether the results of the RTS noise simulation satisfy one or more performance parameters, as described above. The one or more performance parameters may include an RTS noise level threshold for one or more components included in the electronic circuit, an RTS noise level threshold for a portion of the electronic circuit, an RTS noise level threshold for the overall electronic circuit, and/or other performance parameters.

As further shown in FIG. 7, if the results of the RTS noise simulation satisfy the one or more performance parameters (block 720—Yes), process 700 may include ending the RTS noise simulation (block 730). For example, the device (e.g., using computing hardware 203, processors 207, memory 208, storage components 209, networking components 210, processor 320, memory 330, storage component 340, input component 350, output component 360, communication interface 370, and/or the like) may end the RTS noise simulation. If the results of the RTS noise simulation do not satisfy the one or more performance parameters (block 720—No), process 700 may include automatically modifying the electronic circuit based on the results of the RTS noise simulation (block 740). For example, the device (e.g., using computing hardware 203, processors 207, memory 208, storage components 209, networking components 210, processor 320, memory 330, storage component 340, input component 350, output component 360, communication interface 370, and/or the like) may automatically modify the electronic circuit based on the results of the RTS noise simulation, as described above.

Process 700 may include additional implementations, such as any single implementation or any combination of implementations described below and/or in connection with one or more other processes described elsewhere herein. Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Figure 8:
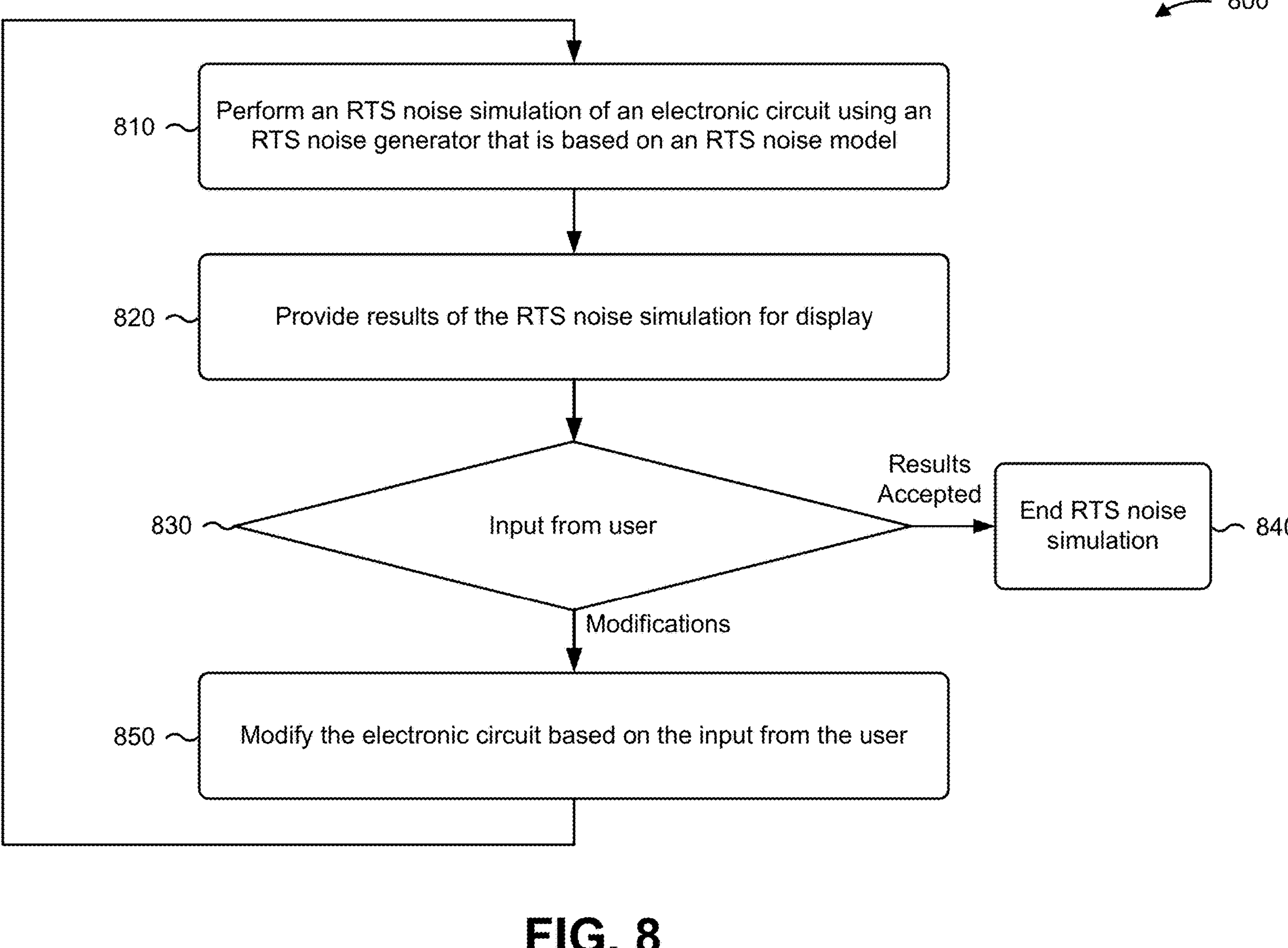

FIG. 8 is a flow chart of an example process 800 associated with electronic circuit simulation based on random telegraph signal noise. In some implementations, one or more process blocks of FIG. 8 may be performed by a device (e.g., the circuit simulator device 102 of FIGS. 1A-1E, circuit simulator platform 201, cloud computing system 202, computing hardware 203, client device 230, and/or the like). Additionally, or alternatively, one or more process blocks of FIG. 8 may be performed by one or more components of a device 300, such as processor 320, memory 330, storage component 340, input component 350, output component 360, communication interface 370, and/or the like.

As shown in FIG. 8, process 800 may include performing an RTS noise simulation of an electronic circuit using an RTS noise generator that is based on an RTS noise model (block 810). For example, the device (e.g., using computing hardware 203, processors 207, memory 208, storage components 209, networking components 210, processor 320, memory 330, storage component 340, input component 350, output component 360, communication interface 370, and/or the like) may perform an RTS noise simulation of an electronic circuit using an RTS noise generator that is based on an RTS noise model, as described above.

As further shown in FIG. 8, process 800 may include providing results of the RTS noise simulation for display (block 820). For example, the device (e.g., using computing hardware 203, processors 207, memory 208, storage components 209, networking components 210, processor 320, memory 330, storage component 340, input component 350, output component 360, communication interface 370, and/or the like) may provide results of the RTS noise simulation for display by the device or for display by another device.

As further shown in FIG. 8, process 800 may include receiving input from a user based on providing the results of the RTS noise simulation for display (block 830). For example, the device (e.g., using computing hardware 203, processors 207, memory 208, storage components 209, networking components 210, processor 320, memory 330, storage component 340, input component 350, output component 360, communication interface 370, and/or the like) receive input from a user based on providing the results of the RTS noise simulation for display.

As further shown in FIG. 8, if the input indicates that the results of the RTS noise simulation are accepted (block 830—Results Accepted), process 800 may include ending the RTS noise simulation (block 840). For example, the device (e.g., using computing hardware 203, processors 207, memory 208, storage components 209, networking components 210, processor 320, memory 330, storage component 340, input component 350, output component 360, communication interface 370, and/or the like) may end the RTS noise simulation. If the input indicates one or more modifications to the electronic circuit based on the results of the RTS noise simulation (block 830—Modifications), process 800 may include modifying the electronic circuit based on the input from the user (block 850). For example, the device (e.g., using computing hardware 203, processors 207, memory 208, storage components 209, networking components 210, processor 320, memory 330, storage component 340, input component 350, output component 360, communication interface 370, and/or the like) may modify the electronic circuit based on the input from the user, as described above.

Process 800 may include additional implementations, such as any single implementation or any combination of implementations described below and/or in connection with one or more other processes described elsewhere herein. Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

In this way, one or more devices (e.g., the circuit simulator device 102 of FIGS. 1A-1E, circuit simulator platform 201, client device 230, device 300, and/or the like) may use an RTS noise model in an RTS generator to generate simulated RTS noise. The simulated RTS noise may be used to simulate and/or determine an expected output signal from a transistor in an electronic circuit design and/or simulation environment. The RTS generator can select and adjust particular parameters for generating simulated RTS noise, such as voltage and/or electrical current bias, temperature, geometry, and/or the like. In this way, the RTS noise model and associated RTS noise generator can be used to simulate the impact of RTS noise on a transistor in an electronic circuit. This permits a circuit designer to design the electronic circuit in a manner that reduces the impact of RTS noise, which improves the design of the electronic circuit. Moreover, having an accurate RTS noise model reduces the cycle time for design, layout, and/or testing of the electronic circuit, and can increase production yields for electronic circuit by reducing the quantity of failed acceptance tests due to RTS noise for devices in which the electronic circuit is included.

As described in greater detail above, some implementations described herein provide a method. The method may include generating, by one or more processors and RTS noise generator, a simulated RTS noise as input to a transistor included in an electronic circuit. The method may include determining, by the one or more processors and based on the simulated RTS noise input to the transistor, a simulated output signal from the transistor.

As described in greater detail above, some implementations described herein provide a non-transitory computer-readable medium storing instructions. The instructions may include one or more instructions that, when executed by one or more processors, cause the one or more processors to generate, using an RTS noise generator in an electronic circuit simulator, respective simulated RTS noise inputs to each of a plurality of transistors included in an electronic circuit. The RTS noise generator may be based on an RTS noise model. The instructions may include one or more instructions that, when executed by one or more processors, cause the one or more processors to determine, based on the respective simulated RTS noise inputs, respective simulated output signals from each of the plurality of transistors.

As described in greater detail above, some implementations described herein provide a device. The device may include one or more memories and one or more processors communicatively coupled to the one or more memories. The one or more memories and the one or more processors may receive information identifying an electronic circuit. The one or more memories and the one or more processors may simulate, based on an RTS noise model, an output from a drain of a transistor included in the electronic circuit. The one or more memories and the one or more processors may automatically modify, based on the output, the electronic circuit to reduce expected RTS noise effects of the electronic circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

inserting, by one or more processors, a random telegraph signal (RTS) noise generator into an electronic circuit provided by a user;

generating, by the one or more processors, using the RTS noise generator, and according to a standalone RTS noise model and a transistor model, a simulated RTS noise as an input to a gate of a transistor included in the electronic circuit, wherein the standalone RTS noise model comprises:

a time domain component defining one or more expected transitions between two or more discrete voltage levels for each of a plurality of transistors included in an electronic circuit over a time duration, and a frequency domain component identifying a drain current spectral density over a frequency range for each of the plurality of transistors over the time duration, wherein the drain current spectral density is based on: one or more simulation parameters for the transistor, a frequency of the transistor, or a cutoff frequency of the transistor, and wherein the transistor model is associated with simulating a performance of the transistor for stress-effect modeling of the transistor;

determining, by the one or more processors and based on generating the simulated RTS noise as input to the transistor, a simulated output signal from a drain of the transistor;

determining, by the one or more processors, that the simulated output signal does not satisfy a threshold tolerance; and automatically modifying, by the one or more processors and based on determining that the simulated output signal does not satisfy the threshold tolerance, the electronic circuit to satisfy the threshold tolerance, wherein the automatically modifying the electronic circuit comprises at least one of:

rearranging or replacing one or more components, including the transistor, included in the electronic circuit, adding the one or more components to the electronic circuit, removing the one or more components included in the electronic circuit, or shortening, lengthening, or rerouting electrical traces between two or more components, including the one or more components, included in the electronic circuit.

2. The method of claim 1, wherein the simulated RTS noise is input to a gate of the transistor; and wherein determining the simulated output signal from the transistor comprises:

determining the simulated output signal from a drain of the transistor.

3. The method of claim 1, further comprising:

generating the simulated RTS noise as input to another transistor of the one or more components included in the electronic circuit.

4. The method of claim 1, wherein the one or more simulation parameters comprise at least one of:

a simulated operating temperature of the transistor, or a simulated geometry of the transistor.

5. The method of claim 1, wherein generating the simulated RTS noise as input to the transistor comprises:

adjusting the one or more simulation parameters; and generating, based on adjusting the one or more simulation parameters, the simulated RTS noise as input to the transistor.

6. The method of claim 5, wherein determining the simulated output signal from the transistor comprises:

determining the simulated output signal from the transistor based on the simulated RTS noise being generated based on adjusting the one or more simulation parameters.

7. A non-transitory computer-readable medium storing instructions, the instructions comprising:

one or more instructions that, when executed by one or more processors, cause the one or more processors to:

obtain a standalone random telegraph signal (RTS) noise model and a transistor model using a model interface application programing interface (API), wherein the standalone RTS noise model comprises:

a time domain component defining one or more expected transitions between two or more discrete voltage levels for each of a plurality of transistors included in an electronic circuit over a time duration, and a frequency domain component identifying a drain current spectral density over a frequency range for each of the plurality of transistors over the time duration, wherein the drain current spectral density is based on at least two of: a simulation parameter for a respective transistor of the plurality of transistors, a frequency for the respective transistor, or a cutoff frequency for respective transistor, and wherein the transistor model is associated with simulating a performance of each of the plurality of transistors for stress-effect modeling of the plurality of transistors;

configure, using the standalone RTS noise model and transistor model, an RTS noise generator for each of the plurality of transistors;

generate, using the RTS noise generator in an electronic circuit simulator, respective simulated RTS noise inputs to each of the plurality of transistors;

determine, based on the respective simulated RTS noise inputs, respective simulated output signals from each of the plurality of transistors;

determine, by the one or more processors, that at least one of the respective simulated output signals does not satisfy a threshold tolerance; and automatically modify, by the one or more processors and based on determining that the at least one of the respective simulated output signals does not satisfy the threshold tolerance, the electronic circuit to satisfy the threshold tolerance, wherein the one or more instructions, that cause the one or more processors to automatically modify the electronic circuit based on the respective simulated output signal, cause the one or more processors to:

rearrange or replace one or more components, including the plurality of transistors, included in the electronic circuit, add the one or more components to the electronic circuit, remove the one or more components included in the electronic circuit, or shorten, lengthen, or reroute electrical traces between two or more components, including the one or more components, included in the electronic circuit.

8. The non-transitory computer-readable medium of claim 7, wherein the one or more instructions, that cause the one or more processors to determine the respective simulated output signals from each of the plurality of transistors, cause the one or more processors to:

determine, for each transistor of the plurality of transistors:

a time domain simulated output signal based on the time domain component; and a frequency domain simulated output signal based on the frequency domain component.

9. The non-transitory computer-readable medium of claim 7, wherein the time domain component further defines one or more expected transitions between discrete electrical current levels over the time duration.

10. The non-transitory computer-readable medium of claim 7, wherein the time domain component identifies one or more expected transitions between discrete drain current levels over the time duration.

11. The non-transitory computer-readable medium of claim 7, wherein the frequency domain component is based on a Lorentzian line shape waveform.

12. A circuit simulator device, comprising:

an electronic circuit simulator component; and a model interface application programming interface (API) component, wherein the electronic circuit simulator component is to:

receive information identifying an electronic circuit;

cause the model interface API component to obtain a standalone random telegraph signal (RTS) noise model and a transistor model to provide the standalone RTS noise model and the standalone RTS noise model to the electronic circuit simulator component, wherein the standalone RTS noise model comprises a frequency domain component identifying a drain current spectral density over a frequency range, wherein the drain current spectral density is based on at least two of: a simulation parameter for a transistor included in the electronic circuit, a frequency of the transistor, or a cutoff frequency of the transistor, and wherein the transistor model is associated with simulating a performance of the transistor for stress-effect modeling of the transistor;

configure, based on the standalone RTS noise model and transistor model, an RTS noise generator for the transistor;

insert the RTS noise generator in the electronic circuit, wherein the RTS noise generator is inserted as an input to a gate of the transistor;

perform an RTS noise simulation of the electronic circuit to simulate an output from a drain of the transistor based on the RTS noise generator, wherein the RTS noise simulation includes:

using different combinations of a plurality of simulation parameters, including the simulation parameter, associated with the transistor, or using different values for the plurality of simulation parameters associated with the transistor; and automatically modify the electronic circuit based on the output to reduce expected RTS noise effects of the electronic circuit, wherein, to automatically modify the electronic circuit, the electronic circuit simulator component is to perform at least one of:

rearrange or replace one or more components, including the transistor, included in the electronic circuit, add the one or more components to the electronic circuit, remove the one or more components included in the electronic circuit, or shorten, lengthen, or reroute electrical traces between two or more components, including the one or more components, included in the electronic circuit.

13. The circuit simulator device of claim 12, wherein the electronic circuit simulator component, when performing the RTS noise simulation of the electronic circuit, is to:

generate an RTS noise input to the gate of the transistor based on at least one of:

a direct current (DC) voltage bias associated with the transistor, or a current bias associated with the transistor; and simulate, based on the RTS noise input, the output from the drain of the transistor.

14. The circuit simulator device of claim 12, wherein the electronic circuit simulator component is further to:

automatically perform a plurality of iterative RTS noise simulations for one or more modified versions of the electronic circuit based on automatically modifying the electronic circuit.

15. The circuit simulator device of claim 12, wherein the electronic circuit simulator component is further to:

provide results of simulating the output for display to a user;

receive, based on providing the results of simulating the output for display to the user, input indicating:

one or more modifications to the electronic circuit, and an instruction to rerun the RTS noise simulation of the electronic circuit;

generate a modified electronic circuit based on the one or more modifications; and perform the RTS noise simulation on the modified electronic circuit.

16. The method of claim 1, further comprising:

providing the simulated output signal for display to the user.

17. The method of claim 1, wherein the one or more simulation parameters include a temperature of the transistor or a simulated environmental temperature of the transistor.

18. The method of claim 1, further comprising:

rerunning an RTS noise simulation on the modified electronic circuit.

19. The non-transitory computer-readable medium of claim 7, wherein the one or more instructions, that cause the one or more processors to determine respective simulated output signals from each of the plurality of transistors, cause the one or more processors to:

determine a first simulated output signal, of the respective simulated output signals, from a drain of a first transistor, of the plurality of transistors, based on a first simulated RTS noise input to a gate of the first transistor; and determine a second simulated output signal, of the respective simulated output signals, from a drain of a second transistor, of the plurality of transistors, based on the first simulated output signal being provided as a second simulated RTS noise input to a gate of the second transistor.

20. The non-transitory computer-readable medium of claim 19, wherein the RTS noise generator for the first transistor receives an input signal and provides a simulated RTS noise input to the gate of the first transistor, and wherein the RTS noise generator for the second transistor receives the first simulated output signal provides the second simulated RTS noise input to the gate of the second transistor.

* * * * *